(12) United States Patent
Kang et al.

(10) Patent No.: US 11,637,057 B2
(45) Date of Patent: Apr. 25, 2023

(54) UNIFORM VIA PAD STRUCTURE HAVING COVERED TRACES BETWEEN PARTIALLY COVERED PADS

(71) Applicant: QUALCOMM Incorporated, San Diego, CA (US)

(72) Inventors: Kuiwon Kang, San Diego, CA (US); Chin-Kwan Kim, San Diego, CA (US); Aniket Patil, San Diego, CA (US); Jaehyun Yeon, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 16/724,247

(22) Filed: Dec. 21, 2019

(65) Prior Publication Data

US 2020/0219803 A1    Jul. 9, 2020

Related U.S. Application Data

(60) Provisional application No. 62/789,472, filed on Jan. 7, 2019.

(51) Int. Cl.
H01L 23/498    (2006.01)
H01L 21/48    (2006.01)

(52) U.S. Cl.
CPC .... *H01L 23/49838* (2013.01); *H01L 21/4846* (2013.01)

(58) Field of Classification Search
CPC .................................................. H01L 23/49838
See application file for complete search history.

(56) References Cited

U.S. PATENT DOCUMENTS

| | | | |
|---|---|---|---|
| 2014/0085847 A1* | 3/2014 | Takizawa | H05K 1/184 361/761 |
| 2014/0247573 A1* | 9/2014 | Kim | G01R 31/2818 361/767 |
| 2015/0296616 A1* | 10/2015 | Jomaa | H05K 1/112 174/261 |
| 2017/0069558 A1* | 3/2017 | Bang | H01L 24/14 |
| 2017/0323926 A1* | 11/2017 | Aday | H01L 21/561 |
| 2019/0088603 A1* | 3/2019 | Marimuthu | H01L 21/486 |
| 2020/0091097 A1* | 3/2020 | Hung | H01L 24/19 |
| 2020/0279814 A1* | 9/2020 | Huang | H01L 23/552 |
| 2021/0118785 A1* | 4/2021 | Lin | H01L 21/4853 |
| 2021/0159158 A1* | 5/2021 | Chen | H01L 23/5383 |

\* cited by examiner

*Primary Examiner* — Michael Jung
(74) *Attorney, Agent, or Firm* — Muncy, Geissler, Olds & Lowe, P.C.

(57) ABSTRACT

Examples herein provide more integrated circuit packages that allow direct bonding of semiconductor chips to the package, smaller line/spacing of traces, and uniform vias with no capture or cover pads. For example, an integrated circuit (IC) package may include a plurality of pads and a plurality of traces on a substrate with at least two of the plurality of traces located between two of the plurality of pads, and a dielectric layer that completely covers the plurality of traces and partially covers the plurality of pads.

8 Claims, 14 Drawing Sheets

US 11,637,057 B2

UNIFORM VIA PAD STRUCTURE HAVING COVERED TRACES BETWEEN PARTIALLY COVERED PADS

CROSS-REFERENCE TO RELATED APPLICATIONS

The present Application for Patent claims the benefit of Provisional Application No. 62/789,472 entitled "UNIFORM VIA PAD STRUCTURE" filed Jan. 7, 2019, assigned to the assignee hereof, and expressly incorporated herein by reference in its entirety.

FIELD OF DISCLOSURE

This disclosure relates generally to via pads, and more specifically, but not exclusively, to uniform shape via pads.

BACKGROUND

Die bonding is the process of attaching the semiconductor die either to its package or to some substrate. The process starts with picking the target die from a wafer or waffle tray. The most common method is to push the target die from the tape with a pin. The tape can also be drawn away from the die by vacuum. The released die is generally picked by a vacuum tool and aligned to a target pad on the carrier or substrate, and then permanently attached, using one of several die bonding techniques, such as thermal compression bonding. A thermal compression bonding process is a process used to assemble/package a flip chip, die or semiconductor device to a packaging substrate. Such a flip chip is often referred to as a thermal compression flip chip (TCFC). Thermal compression bonding processes provide several advantages over traditional bonding processes. For example, thermal compression bonding processes are generally more accurate than other solder bonding processes. Thus, thermal compression bonding processes are ideal when using fine pitch traces on a substrate (e.g., less than 100 microns (μm)). In contrast, other solder bonding processes are limited to a bonding pitch that is greater than 100 microns (μm). Thus, TCFCs are typically higher density chips than chips using other bonding processes.

Due to current design rules, no direct chip bonding is allowed for TCFCs. Furthermore, conventional designs use a captured pad size bigger than the via size and a cover pad size also bigger than the via size. However, via formation is always a cost adder points and the more vias, the higher the cost adder. Smaller vias may lead to lower costs but small vias already lead to quality concern. For an integrated circuit (IC) module, current SAP design rules make it hard to support fine Line/Spacing (L/S: width of trace/spacing between traces) pitch as well as making it difficult to support direct chip bonding on an IC module. In addition, embedded trace substrate (ETS) design rules recite a capture pad and a cover pad for the via structure, which may cause design limitations and small vias that incur higher costs due to new machine requirements for manufacturing ETS IC modules.

For example, in a chip set substrate the M1 metal layer pattern process may use an ETS with L/S (SR trench) of 8 μm/10 μm when using a 90 μm bump pitch with two traces escape. In a module printed circuit board (PCB) the M1 metal layer pattern process may use a semi-additive process with L/S (SR trench) of 16 μm/12 μm when using a 112 μm bump pitch with two traces escape.

Accordingly, there is a need for systems, apparatus, and methods that overcome the deficiencies of conventional approaches including the methods, system and apparatus provided hereby.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

In one aspect, an IC package may include: a substrate; a plurality of pads on a first side of the substrate; a plurality of traces on the first side of the substrate, at least two of the plurality of traces located between two of the plurality of pads; and a dielectric layer on the first side of the substrate, wherein the dielectric layer completely covers the plurality of traces and partially covers the plurality of pads such that a portion of each of the plurality of pads is exposed.

In another aspect, an IC package may include: a substrate; a plurality of vias that extend from a first side of the substrate to a second side of the substrate opposite the first side of the substrate; a plurality of traces proximate to the first side of the substrate, at least one of the plurality of traces located between two of the plurality of vias and a surface of each of the plurality of traces co-planar with a surface of each of the plurality of vias; and a plurality of pads on proximate to the second side of the substrate, wherein each of the plurality of vias comprises a bottom portion proximate to the second side of the substrate that extends past a perimeter of a respective one of the plurality of vias.

In still another aspect, an IC package may include: a substrate; means for connection on a first side of the substrate; means for signal routing on the first side of the substrate, at least two of the means for signal routing located between two of the means for connection; and a dielectric layer on the first side of the substrate, wherein the dielectric layer completely covers the means for signal routing and partially covers the means for connection such that a portion of each of the means for connection is exposed.

In still another aspect, a method for manufacturing an IC package may include: providing a substrate; forming a pad on a first side of the substrate; forming a plurality of traces on the first side of the substrate; forming a dielectric layer on the first side of the substrate; and partially removing the dielectric layer to completely cover the plurality of traces and partially cover the pad such that a portion of the pad is exposed.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure, and in which.

Figure 1:
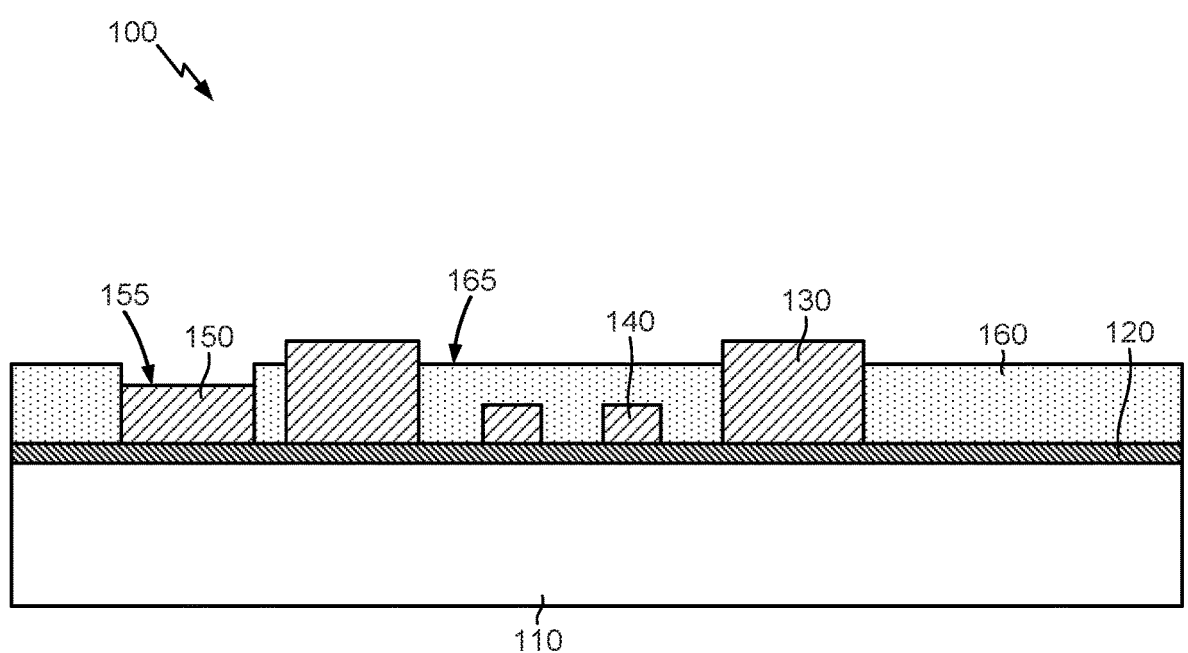
FIG. 1 illustrates an exemplary IC package for direct semiconductor chip attachment with a first layer in accordance with some examples of the disclosure.

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

The exemplary methods, apparatus, and systems disclosed herein mitigate shortcomings of the conventional methods, apparatus, and systems, as well as other previously unidentified needs, such as via will formation by lithography/Cu plating followed by removal of the pad, which can lead to better design rules and cost savings for both module and package chipset application.

FIG. 1 illustrates an exemplary IC package for direct semiconductor chip attachment with a first layer in accordance with some examples of the disclosure. As shown in FIG. 1, an IC package 100 may include a substrate 110; a first layer 120 on a first side 115 of the substrate 110; a plurality of pads 130 on a first side 125 of the first layer 120; a plurality of traces 140 on the first side 125 of the first layer 120 with at least one (or two) of the plurality of traces 140 located between two of the plurality of pads 130; and a dielectric layer 160 on the first side 125 of the first layer 120. The dielectric layer 160 may completely cover the plurality of traces 140 and partially cover the plurality of pads 130 such that a portion of each of the plurality of pads 130 is exposed. The IC package 100 may also include a bump pad 150 on the first side 125 of the first layer 120 with the dielectric layer 160 partially covering the bump pad 150 such that a surface 155 of the bump pad 150 is exposed and below a first surface 165 of the dielectric layer 160 opposite the first layer 120. Each of the plurality of traces may have a width of approximately 10 microns (μm) and be spaced from another of the plurality of traces by a width of approximately 10 microns (μm) (in some cases, less than 6 and 8 respectively). The first layer 120 and the dielectric layer 160 completely surround the plurality of traces 140 to allow for such small line/space dimensions without the plurality of traces 140 lifting or peeling off during the manufacturing process or afterwards. In addition, a center to center distance between each of the plurality of pads may be approximately 90 microns (μm) allowing for multiple escape lines (traces between the pads) in the IC package 100. The IC package 100 may allow the plurality of traces 140 to be burred from below 16 μm trace width with different bump pads 150 and plurality of pads 130 and may be recessed or exposed.

Figure 2:
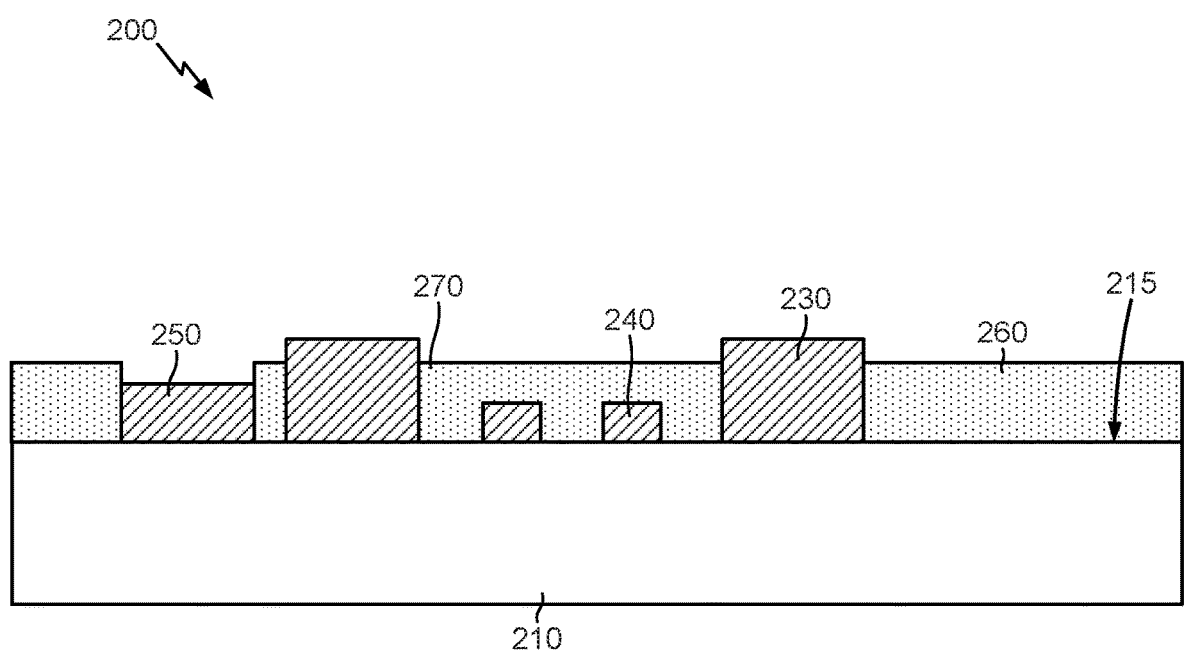
FIG. 2 illustrates an exemplary IC package for direct semiconductor chip attachment without a first layer in accordance with some examples of the disclosure.

FIG. 2 illustrates an exemplary IC package for direct semiconductor chip attachment without a first layer in accordance with some examples of the disclosure. As shown in FIG. 2, an IC package 200 may include a substrate 210; a plurality of pads 230 on a first side 215 of the substrate 210; a plurality of traces 240 on the first side 215 of the substrate 210 with at least one (or two) of the plurality of traces 240 located between two of the plurality of pads 230; and a dielectric layer 260 on the first side 215 of the substrate 210. The dielectric layer 260 may completely cover the plurality of traces 240 and partially cover the plurality of pads 230 such that a portion of each of the plurality of pads 230 is exposed. The IC package 200 may also include a bump pad 250 on the first side 215 of the substrate 210 with the dielectric layer 260 partially covering the bump pad 250 such that a surface 255 of the bump pad 250 is exposed and below a first surface 265 of the dielectric layer 260 opposite the substrate 210. Each of the plurality of traces may have a width of approximately 10 microns (μm) and be spaced from another of the plurality of traces by a width of approximately 10 microns (μm) (in some cases, less than 6 and 8 respectively). The substrate 210 and the dielectric layer 260 completely surround the plurality of traces 240 to allow for such small line/space dimensions without the plurality of traces 240 lifting or peeling off during the manufacturing process or afterwards. In addition, a center to center distance between each of the plurality of pads may be approximately 90 microns (μm) allowing for multiple escape lines (traces between the pads) in the IC package 200.

Figure 3:
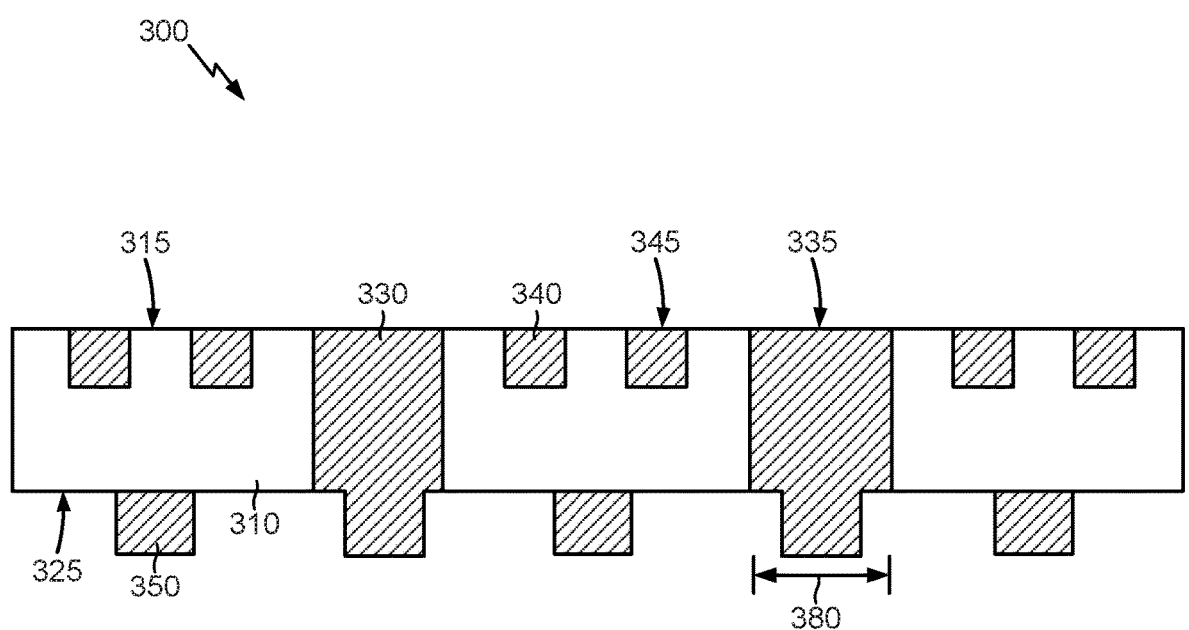
FIG. 3 illustrates an exemplary IC package with embedded traces and a uniform via in accordance with some examples of the disclosure.

FIG. 3 illustrates an exemplary IC package with embedded traces and a uniform via in accordance with some examples of the disclosure. As shown in FIG. 3, an IC package 300 may include a substrate 310; a plurality of vias 330 that extend from a first side 315 of the substrate 310 to a second side 325 of the substrate 310 opposite the first side 315 of the substrate 310; a plurality of traces 340 proximate to the first side 315 of the substrate 310, at least one (or two) of the plurality of traces 340 located between two of the plurality of vias 330, a surface 345 of each of the plurality of traces 340 co-planar with a surface 335 of each of the plurality of vias 330 on the first side 315 of the substrate 310, and a plurality of pads 350 on the second side 325 of the substrate 310. The IC package 300 may also include the plurality of traces 340 embedded in the substrate 310 and, at least one of the plurality of pads 350 on each of the plurality of vias 330. In addition, the pads 350 on each of the vias 330 may be within a perimeter 380 of a respective one of the plurality of vias 330. In IC package 300, the outer layer pad (capture pad) may be the same size as the via 330, the via 330 may be a single uniform shape such as a rectangle or cylinder with no taper or steps and no dimple (unless a Via under Trace (VuT) as shown in FIG. 6) that allows a size reduction under 30 μm height with better via reliability, and the inner layer pad 350 (cover pad) may be smaller than the via size.

Figure 4:
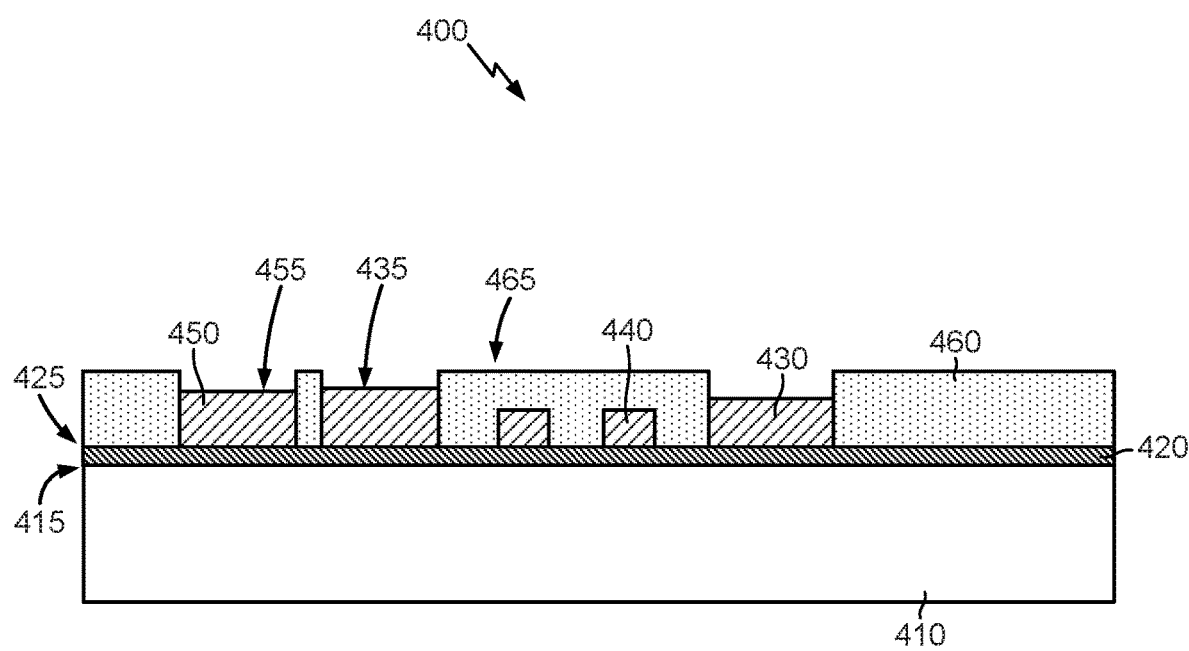
FIG. 4 illustrates an exemplary IC package for direct semiconductor chip attachment with a first layer and recessed bumps in accordance with some examples of the disclosure.

FIG. 4 illustrates an exemplary IC package for direct semiconductor chip attachment with a first layer and recessed bumps in accordance with some examples of the disclosure. As shown in FIG. 4, an IC package 400 (e.g., IC package 100) may include a substrate 410; a first layer 420 on a first side 415 of the substrate 410; a plurality of pads 430 on a first side 425 of the first layer 420; a plurality of traces 440 on the first side 425 of the first layer 420 with at least one (or two) of the plurality of traces 440 located between two of the plurality of pads 430; and a dielectric layer 460 on the first side 425 of the first layer 420. The dielectric layer 460 may completely cover the plurality of traces 440 and partially cover the plurality of pads 430 such that a portion of each of the plurality of pads 430 is exposed. The IC package 400 may also include a bump pad 450 on the first side 425 of the first layer 420 with the dielectric layer 460 partially covering the bump pad 450 such that a surface 455 of the bump pad 450 is exposed and below a first surface 465 of the dielectric layer 460 opposite the first layer 420. The surface 455 of bump pad 450 may be co-planar with a surface 435 of the plurality of pads 430. In addition, the height and width of bump pad 450 may be the same as each of the plurality of pads 430. Each of the plurality of traces may have a width of approximately 10 microns (μm) and be spaced from another of the plurality of traces by a width of approximately 10 microns (μm) (in some cases, less than 6 and 8 respectively). The first layer 420 and the dielectric layer 460 completely surround the plurality of traces 440 to allow for such small line/space dimensions without the plurality of traces 440 lifting or peeling off during the manufacturing process or afterwards. In addition, a center to center distance between each of the plurality of pads may be approximately 90 microns (μm) allowing for multiple escape lines (traces between the pads) in the IC package 400. The IC package 400 may allow the plurality of traces 440 to be burred from below 16 μm trace width with different bump pads 450 and plurality of pads 430 and may be recessed or exposed.

Figure 5:
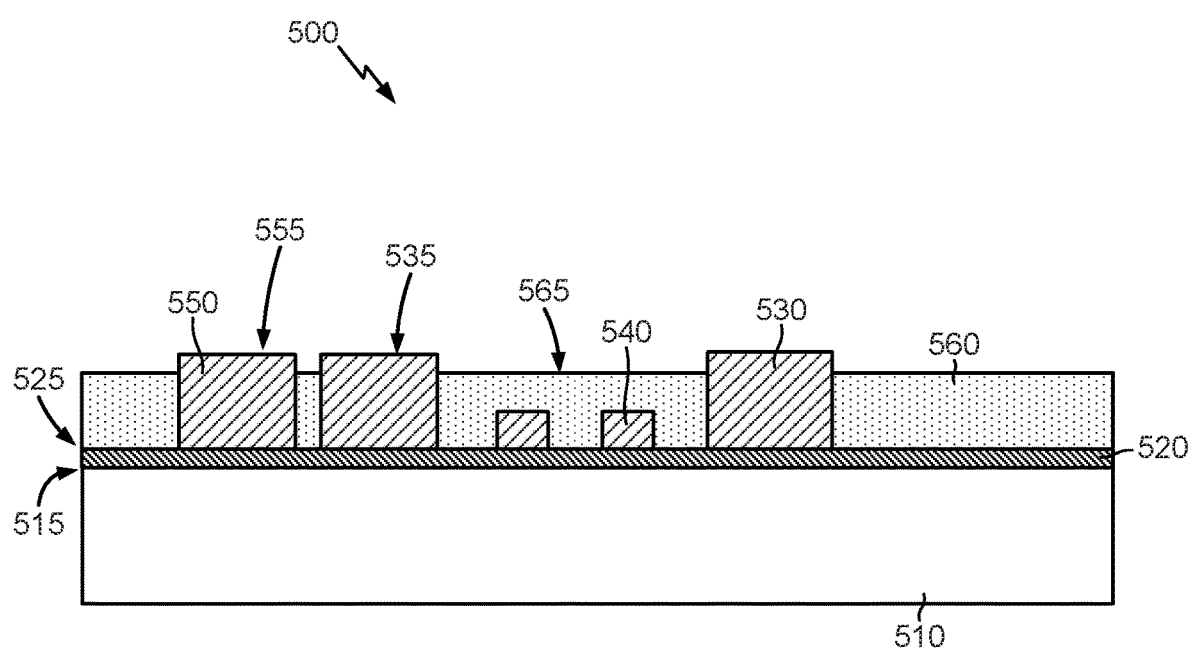
FIG. 5 illustrates an exemplary IC package for direct semiconductor chip attachment with a first layer and without recessed bumps in accordance with some examples of the disclosure.

FIG. 5 illustrates an exemplary IC package for direct semiconductor chip attachment with a first layer and without recessed bumps in accordance with some examples of the disclosure. As shown in FIG. 5, an IC package 500 (e.g., IC package 100) may include a substrate 510; a first layer 520 on a first side 515 of the substrate 510; a plurality of pads 530 on a first side 525 of the first layer 520; a plurality of traces 540 on the first side 525 of the first layer 520 with at least one (or two) of the plurality of traces 540 located between two of the plurality of pads 530; and a dielectric layer 560 on the first side 525 of the first layer 520. The dielectric layer 560 may completely cover the plurality of traces 540 and partially cover the plurality of pads 530 such that a portion of each of the plurality of pads 530 is exposed. The IC package 500 may also include a bump pad 540 on the first side 525 of the first layer 520 with the dielectric layer 560 partially covering the bump pad 550 such that a surface 555 of the bump pad 550 is exposed and above a first surface 565 of the dielectric layer 560 opposite the first layer 520. The surface 555 of bump pad 550 may be co-planar with a surface 535 of the plurality of pads 530. In addition, the height and width of bump pad 550 may be the same as each of the plurality of pads 530. Each of the plurality of traces may have a width of approximately 10 microns (μm) and be spaced from another of the plurality of traces by a width of approximately 10 microns (μm) (in some cases, less than 6 and 8 respectively). The first layer 520 and the dielectric layer 560 completely surround the plurality of traces 540 to allow for such small line/space dimensions without the plurality of traces 540 lifting or peeling off during the manufacturing process or afterwards. In addition, a center to center distance between each of the plurality of pads may be approximately 90 microns (μm) allowing for multiple escape lines (traces between the pads) in the IC package 500. The IC package 500 may allow the plurality of traces 540 to be burred from below 16 μm trace width with different bump pads 550 and plurality of pads 530 and may be recessed or exposed.

Figure 6A:
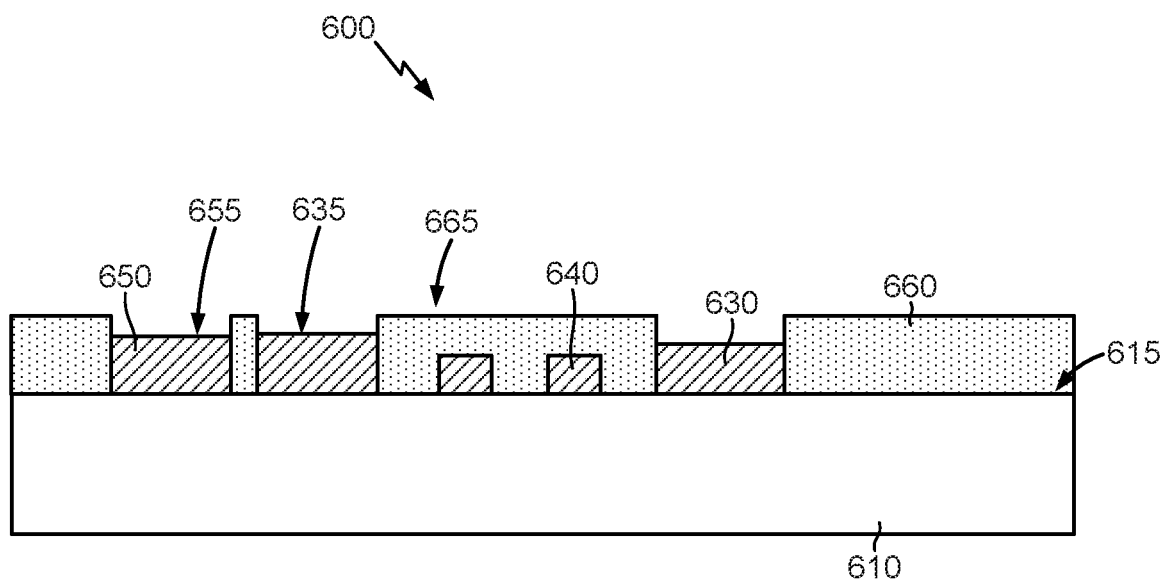
FIGS. 6A and B illustrate exemplary IC packages for direct semiconductor chip attachment without a first layer and recessed pads in accordance with some examples of the disclosure.
Figure 6B:
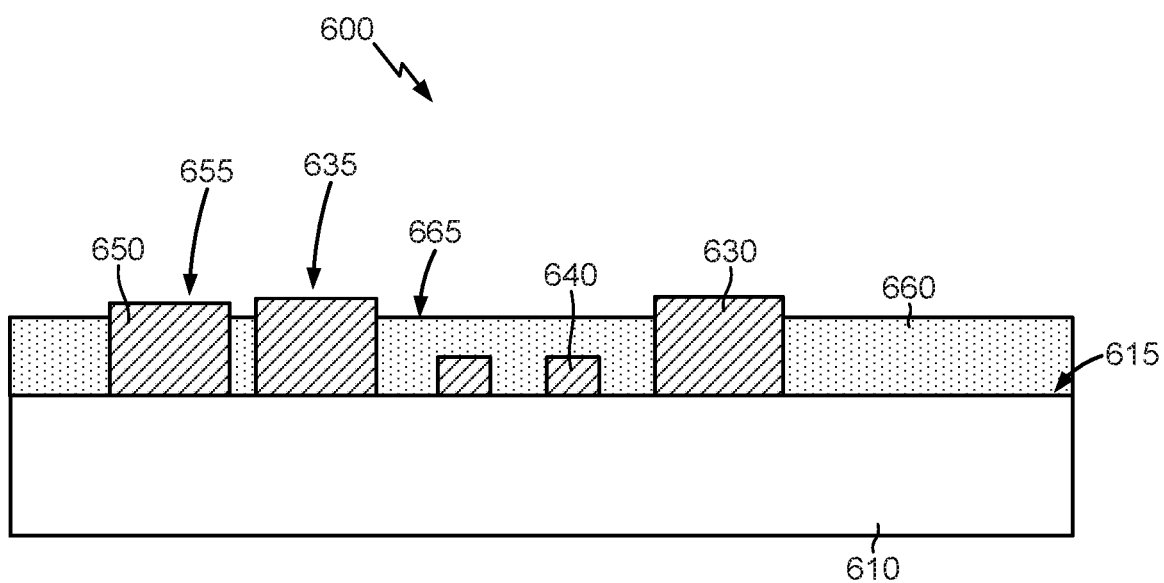

FIGS. 6A and B illustrate exemplary IC packages for direct semiconductor chip attachment without a first layer and recessed pads in accordance with some examples of the disclosure. As shown in FIG. 6, an IC package 600 (e.g., IC package 200) may include a substrate 610; a plurality of pads 630 on a first side 615 of the substrate 610; a plurality of traces 640 on the first side 615 of the substrate 610 with at least one (or two) of the plurality of traces 640 located between two of the plurality of pads 630; and a dielectric layer 660 on the first side 615 of the substrate 610. The dielectric layer 660 may completely cover the plurality of traces 640 and partially cover the plurality of pads 630 such that a portion of each of the plurality of pads 630 is exposed. The IC package 600 may also include a bump pad 650 on the first side 615 of the substrate 610 with the dielectric layer 660 partially covering the bump pad 650 such that a surface 655 of the bump pad 650 is exposed and below (FIG. 6A) or above (FIG. 6B) a first surface 665 of the dielectric layer 660 opposite the substrate 610. The surface 655 of bump pad 650 may be co-planar with a surface 635 of the plurality of pads 630. In addition, the height and width of bump pad 650 may be the same as one of the plurality of pads 630. Each of the plurality of traces may have a width of approximately 10 microns (μm) and be spaced from another of the plurality of traces by a width of approximately 10 microns (μm) (in some cases, less than 6 and 8 respectively). The substrate 610 and the dielectric layer 660 completely surround the plurality of traces 640 to allow for such small line/space dimensions without the plurality of traces 640 lifting or peeling off during the manufacturing process or afterwards. In addition, a center to center distance between each of the plurality of pads may be approximately 90 microns (μm) allowing for multiple escape lines (traces between the pads) in the IC package 600.

Figure 7:
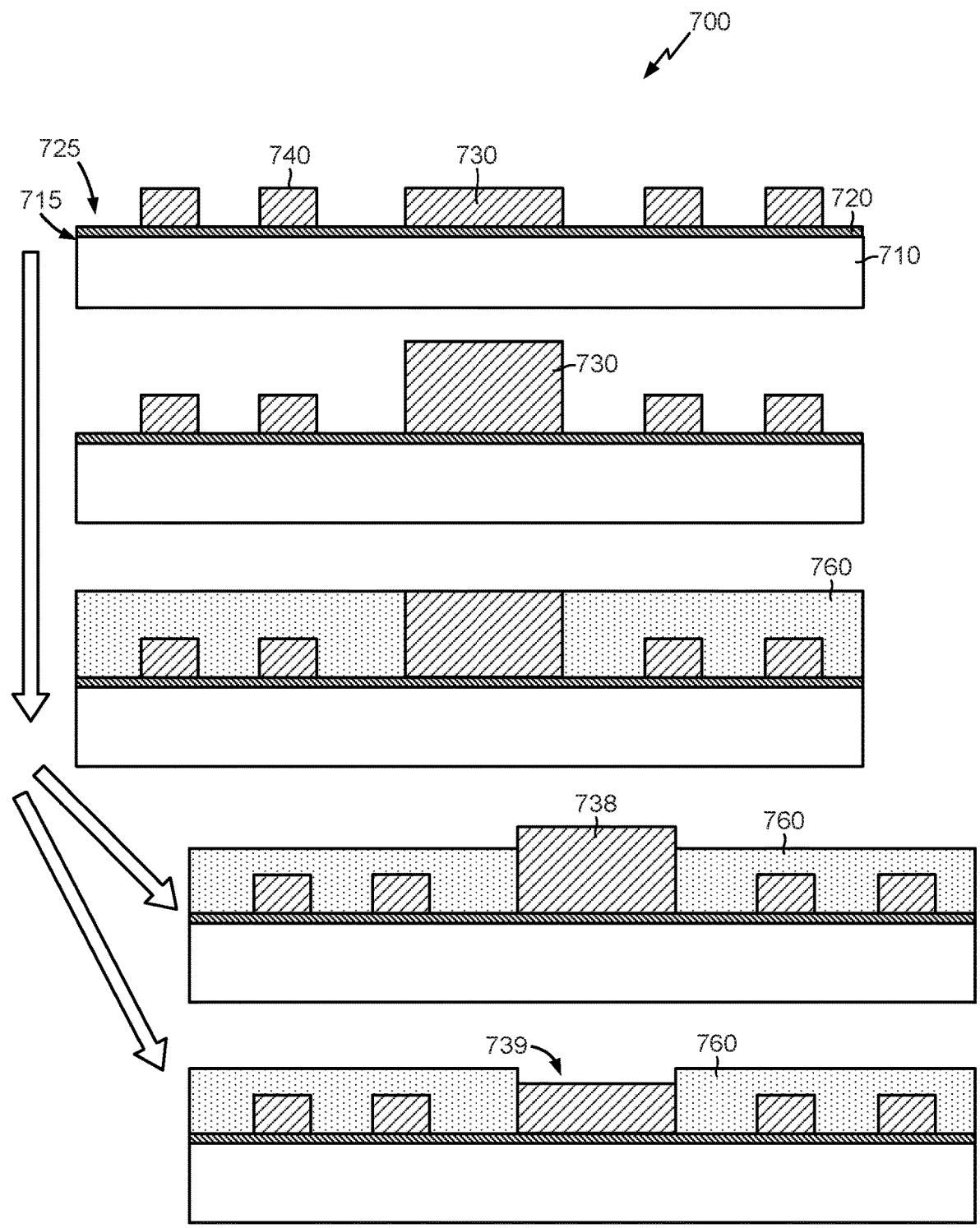
FIG. 7 illustrates an exemplary partial method for manufacturing an IC package (e.g., FIG. 1) for direct semiconductor chip attachment with a first layer in accordance with some examples of the disclosure.

FIG. 7 illustrates an exemplary partial method for manufacturing an IC package (e.g., FIGS. 1, 4, and 5) for direct semiconductor chip attachment with a first layer in accordance with some examples of the disclosure. As shown in FIG. 7, the method 700 may begin with forming an outer layer that includes a substrate 710; a first layer 720 on a first side 715 of the substrate 710; a pad 730 on a first side 725 of the first layer 720; a plurality of traces 740 on the first side 725 of the first layer 720. Next, a bump post plating may be added to the pad 730. Next, a dielectric layer 760 may be formed on the first side 725 of the first layer 720, such as by lamination. Then, the method 700 may remove (e.g., etch) a portion of the dielectric layer 760 so that the dielectric layer 760 completely covers the plurality of traces 740 and partially covers the pad 730 such that a portion 738 of the pad 730 is exposed above the dielectric layer 760. Alternatively, the method 700 may remove (e.g., etch) a portion of the dielectric layer 760 so that the dielectric layer 760 completely covers the plurality of traces 740 and partially covers the pad 730 such that a portion 739 of the pad 730 is recessed below the dielectric layer 760. It should be understood that although one pad 730 is shown, more than one may be used such as in the examples herein.

Figure 8:
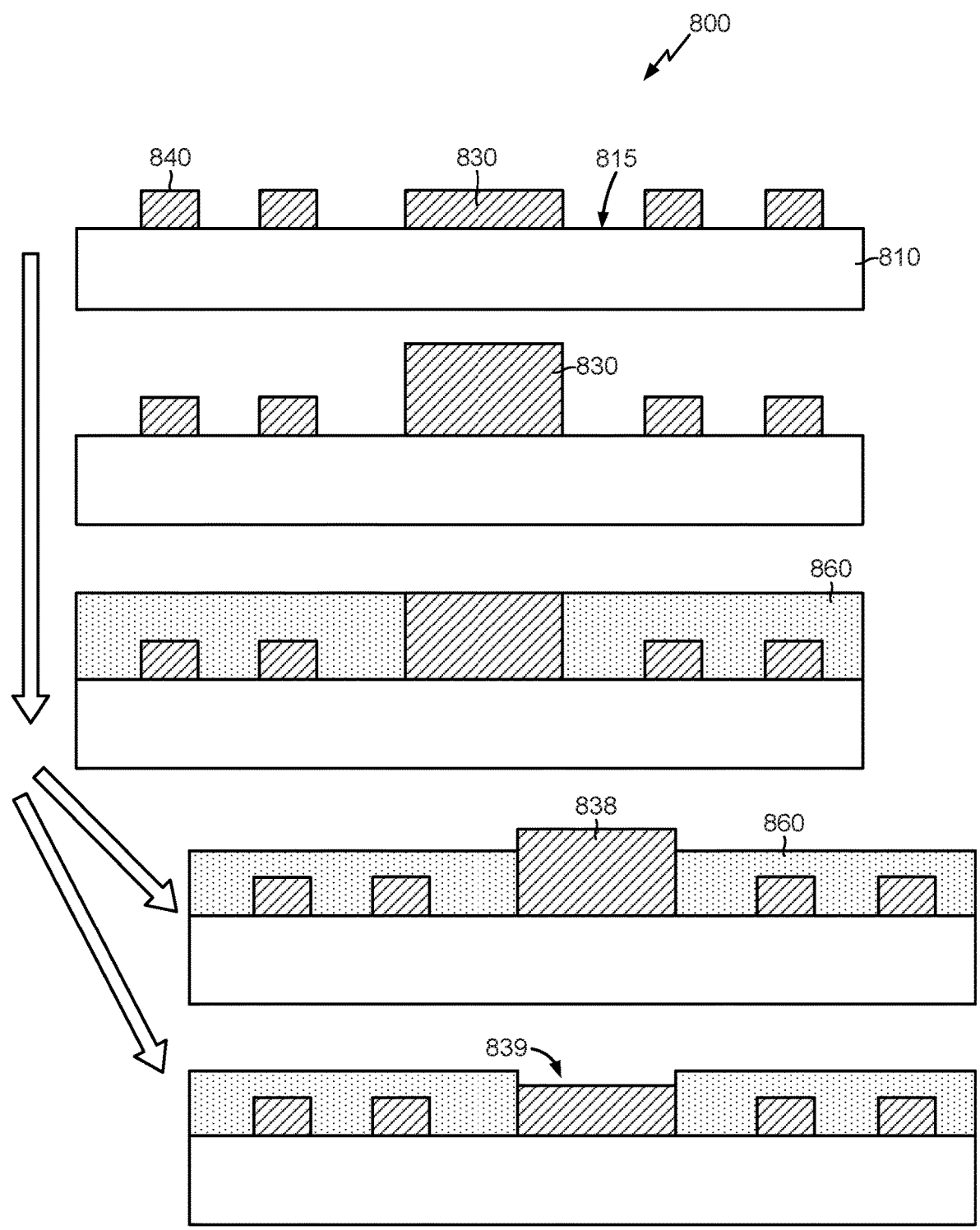
FIG. 8 illustrates an exemplary partial method for manufacturing an IC package (e.g., FIG. 2) for direct semiconductor chip attachment without a first layer in accordance with some examples of the disclosure.

FIG. 8 illustrates an exemplary partial method for manufacturing an IC package (e.g., FIGS. 2, 6A, and 6B) for direct semiconductor chip attachment without a first layer in accordance with some examples of the disclosure. As shown in FIG. 8, the method 800 may being with forming an outer layer that includes a substrate 810; a pad 830 on a first side 815 of the substrate 810; a plurality of traces 840 on the first side 815 of the substrate 810. Next, a bump post plating may be added to the pad 830. Next, a dielectric layer 860 may be formed on the first side 815 of the substrate 810, such as by lamination. Then, the method 800 may remove (e.g., etch) a portion of the dielectric layer 860 so that the dielectric layer 860 completely covers the plurality of traces 840 and partially covers the pad 830 such that a portion 838 of the pad 830 is exposed above the dielectric layer 860. Alternatively, the method 800 may remove (e.g., etch) a portion of the dielectric layer 860 so that the dielectric layer 860 completely covers the plurality of traces 840 and partially covers the pad 830 such that a portion 839 of the pad 830 is recessed below the dielectric layer 860. It should be understood that although one pad 830 is shown, more than one may be used such as in the examples herein.

Figure 9:
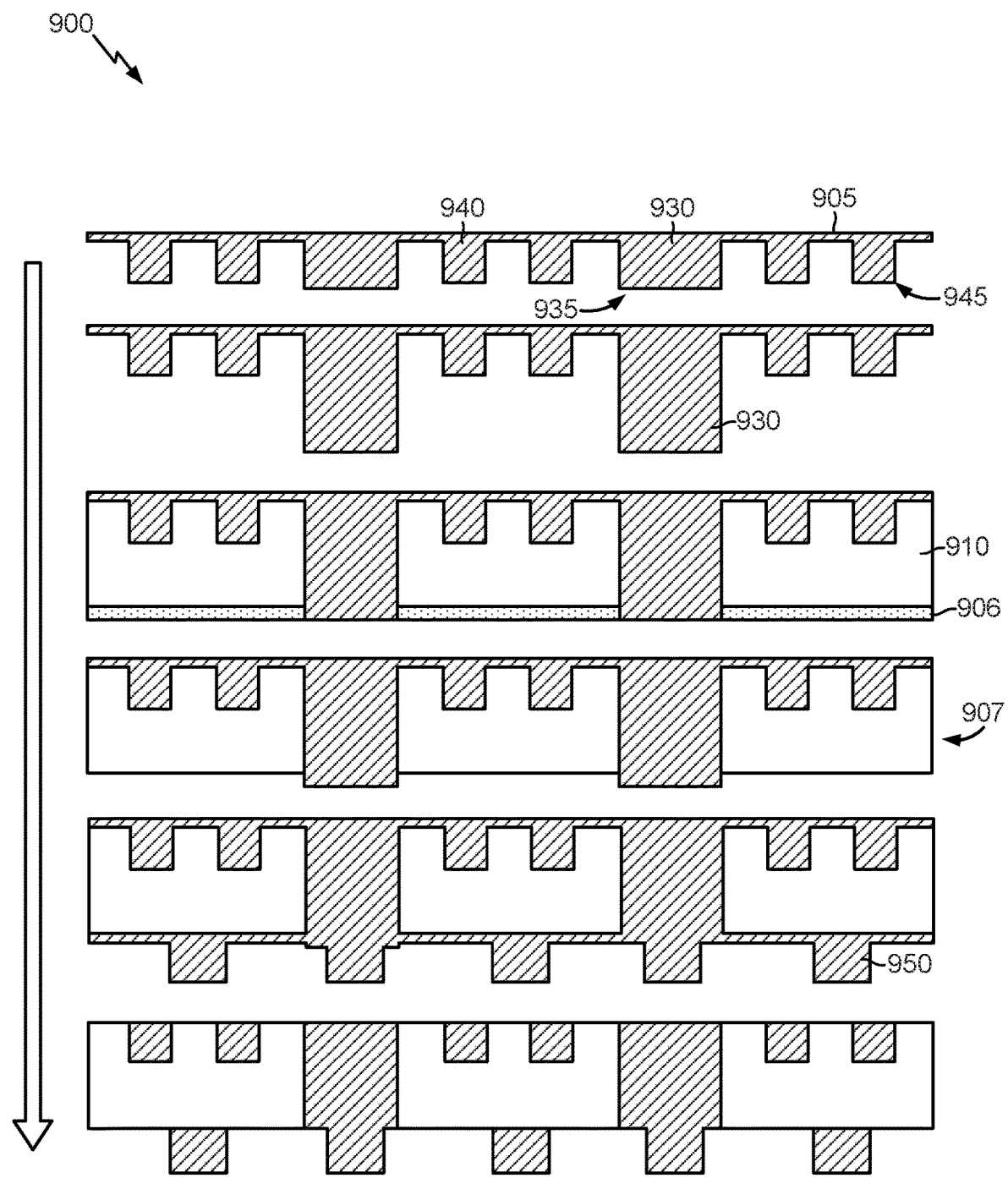
FIG. 9 illustrates an exemplary partial method for manufacturing an IC package with embedded traces and a uniform via in accordance with some examples of the disclosure.

FIG. 9 illustrates an exemplary partial method for manufacturing an IC package with embedded traces and a uniform via in accordance with some examples of the disclosure. As shown in FIG. 9, a method 900 may begin with forming a M1 layer patterning of a first seed layer 905 with a plurality of vias 930 and a plurality of traces 940, at least one (or two) of the plurality of traces 940 located between two of the plurality of vias 930 with a surface 945 of each of the plurality of traces 940 co-planar with a surface 935 of each of the plurality of vias 930 at a height of approximately 13-15 μm. Next, a via post plating is applied to increase the height of the plurality of vias 930 approximately 10-13 μm. Next, a second seed layer 906 is added along with forming a substrate 910 (e.g., ABF/RCC lamination). If method 900 is a semi-additive process (SAP), a coating layer etching 907 may be applied. Next, M2 layer patterning begins with forming a plurality of pads 950, at least one of the plurality of pads 950 on each of the plurality of vias 930. Next, the first seed layer 905 and the second seed layer 906 are removed leaving the pads 950 on each of the vias 930 within a perimeter of a respective one of the plurality of vias 930.

Figure 10:
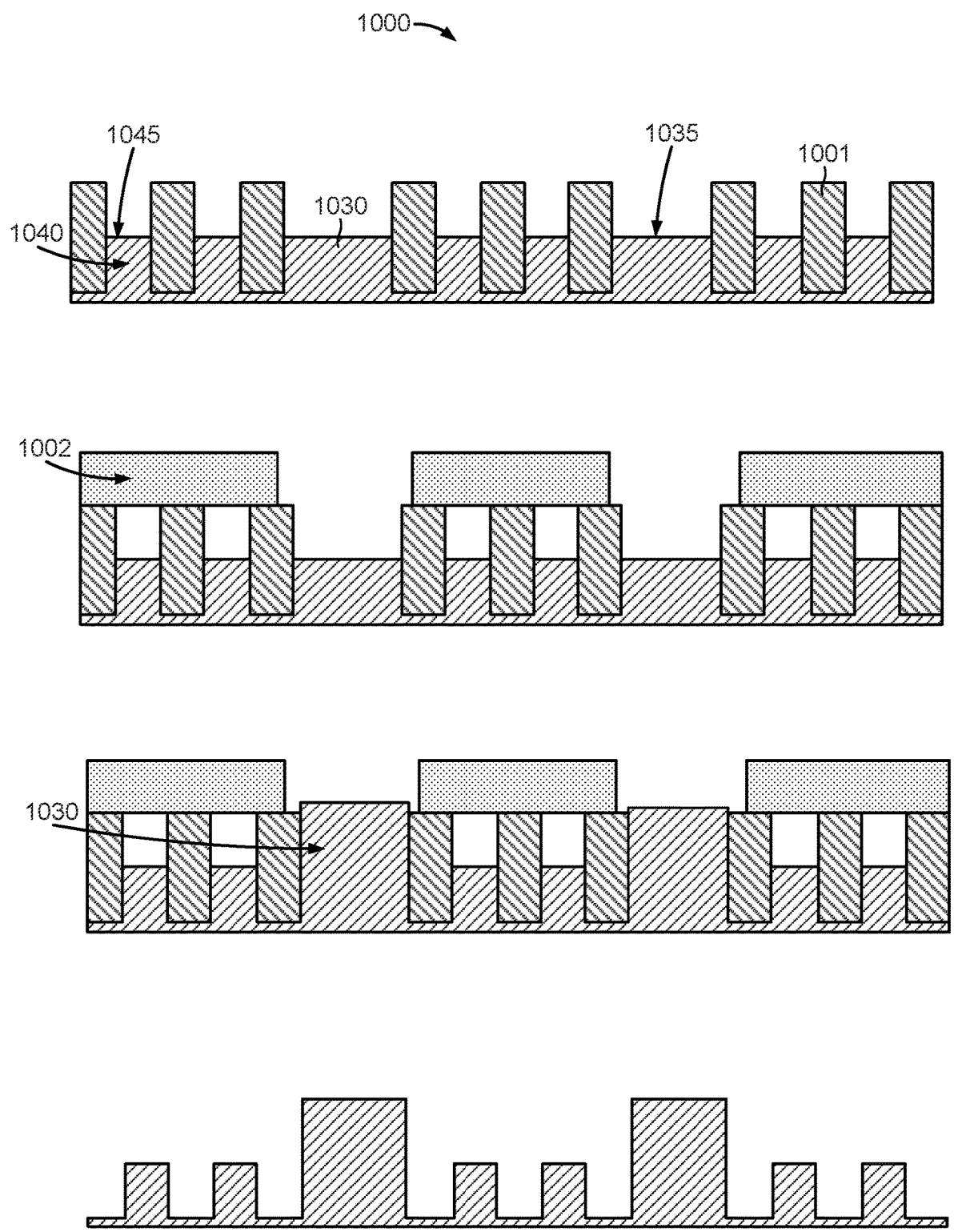
FIG. 10 illustrates an exemplary partial method for manufacturing an IC package with a via or bump post in accordance with some examples of the disclosure.

FIG. 10 illustrates an exemplary partial method for manufacturing an IC package with a via or bump post in accordance with some examples of the disclosure. As shown in FIG. 10, a method 1000 may begin with forming a M1 layer patterning of a first seed layer 1005 with a plurality of vias 1030 and a plurality of traces 1040, at least two of the plurality of traces 1040 located between two of the plurality of vias 1030 with a surface 1045 of each of the plurality of traces 1040 co-planar with a surface 1035 of each of the plurality of vias 1030 at a height of approximately 13-15 μm. In addition, a first dry film resist (DFR) 1001 is applied to a height of approximately 25 μm. Next, a second DFR 1002 is applied over the first DFR 1001 to prevent build-up of the plurality of traces 1040. Next, a via post plating is applied to increase the height of the plurality of vias 1030 approximately 10-13 μm. Next, the first DFR 1001 and the second DFR 1002 are removed.

Figure 11:
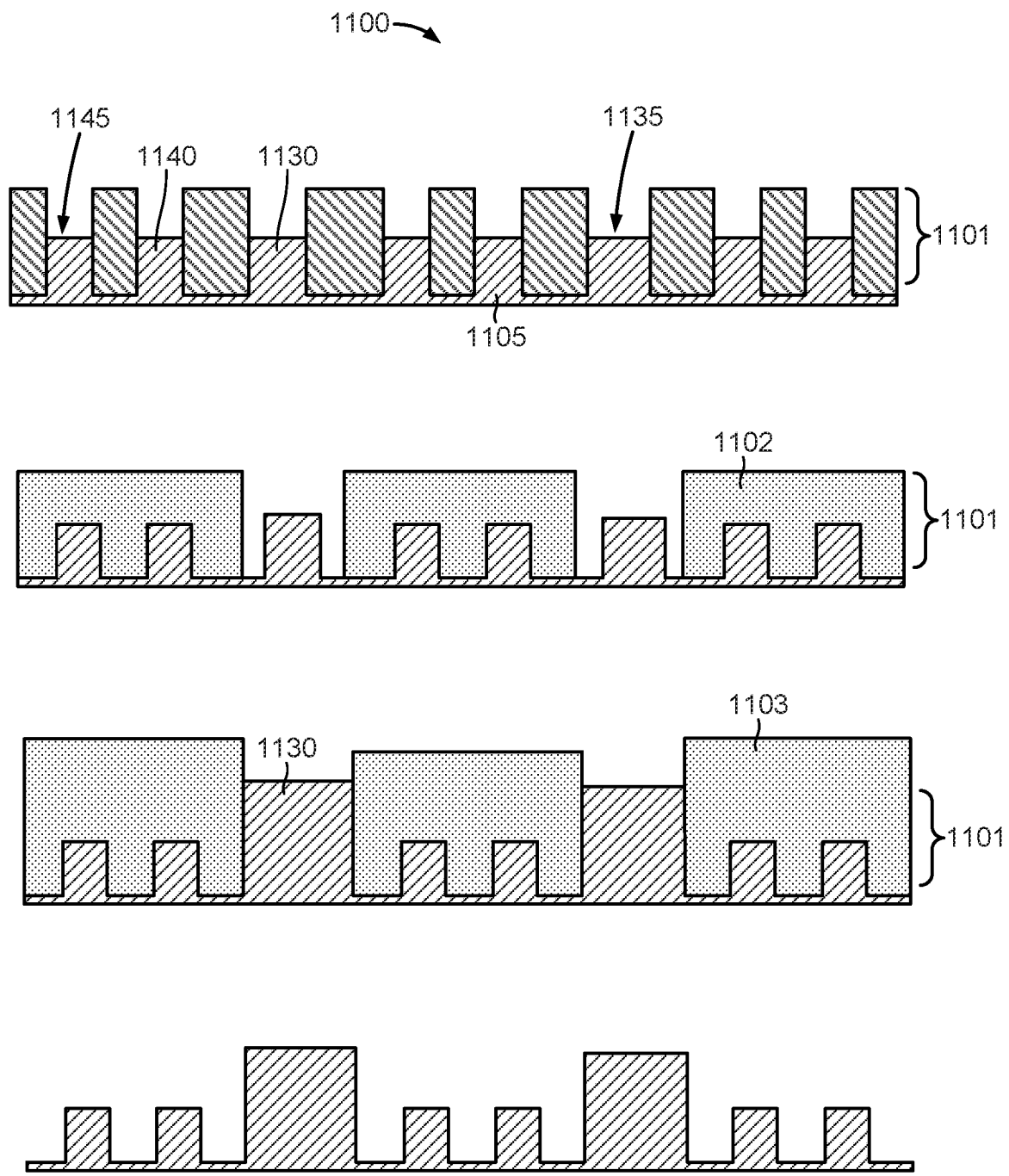
FIG. 11 illustrates another exemplary partial method for manufacturing an IC package with a via or bump post in accordance with some examples of the disclosure.

FIG. 11 illustrates another exemplary partial method for manufacturing an IC package with a via or bump post in accordance with some examples of the disclosure. As shown in FIG. 11, a method 1100 may begin with forming a M1 layer patterning of a first seed layer 1105 with a plurality of vias 1130 and a plurality of traces 1140, at least two of the plurality of traces 1140 located between two of the plurality of vias 1130 with a surface 1145 of each of the plurality of traces 1140 co-planar with a surface 1135 of each of the plurality of vias 1130 at a height of approximately 13-15 μm. In addition, a first dry film resist (DFR) 1101 is applied to a height of approximately 25 μm. Next, a second DFR 1102 is between the first DFR 1101 to prevent build-up of the plurality of traces 1140. Next, a third DFR 1103 is applied before a via post plating is applied to increase the height of the plurality of vias 1130 approximately 11-13 μm. Next, the first DFR 1101, the second DFR 1102, and the third DFR 1103 are removed.

Figure 12:
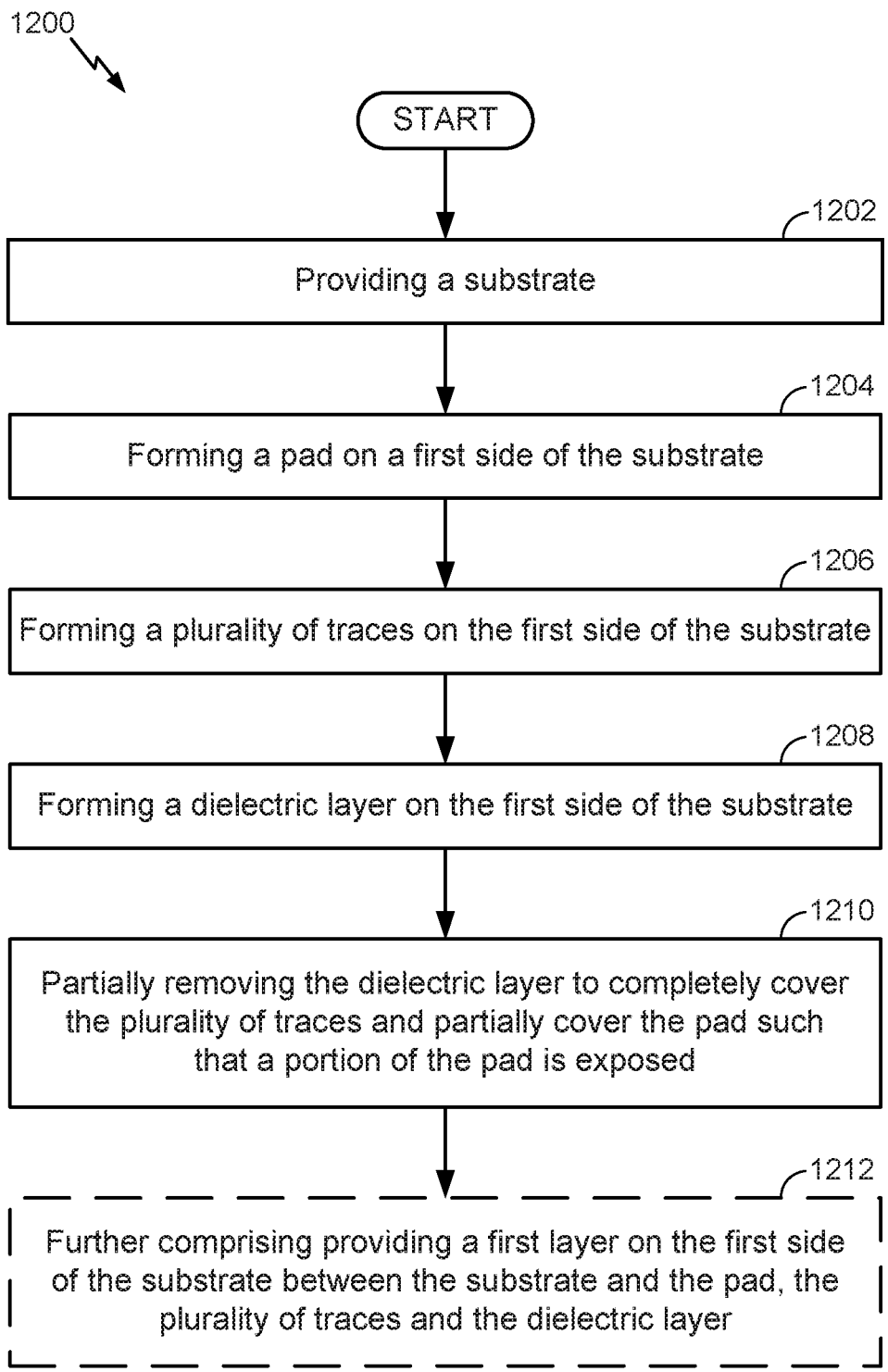
FIG. 12 illustrates an exemplary partial method for manufacturing an IC package in accordance with some examples of the disclosure.

FIG. 12 illustrates an exemplary partial method for manufacturing an IC package in accordance with some examples of the disclosure. As shown in FIG. 12, a partial method 1200 begins in block 1202 with providing a substrate (e.g., substrate 110, 210, 310, 410, 510, 610, 710, 810, and 910). The partial method 1200 continues in block 1204 with forming a pad (e.g., 130 and 230) on a first side of the substrate. The partial method 1200 continues in block 1206 with forming a plurality of traces (e.g., 140 and 240) on the first side of the substrate. The partial method 1200 continues in block 1208 with forming a dielectric layer (e.g., 160 and 260) on the first side of the substrate. The partial method 1200 may conclude in block 1204 with partially removing the dielectric layer to completely cover the plurality of traces and partially cover the pad such that a portion of the pad is exposed. Alternatively, the partial method 1200 may also include providing a first layer on the first side of the substrate between the substrate and the pad, the plurality of traces and the dielectric layer. In addition, the partial method 1200 may also include using adhesive for the first layer, extending the exposed portion of the pad above a surface of the dielectric layer opposite the substrate or recessed below a surface of the dielectric layer, each of the plurality of traces may have a width of approximately 10 microns (μm) and be spaced from another of the plurality of traces by a width of approximately 10 microns (μm).

Figure 13:
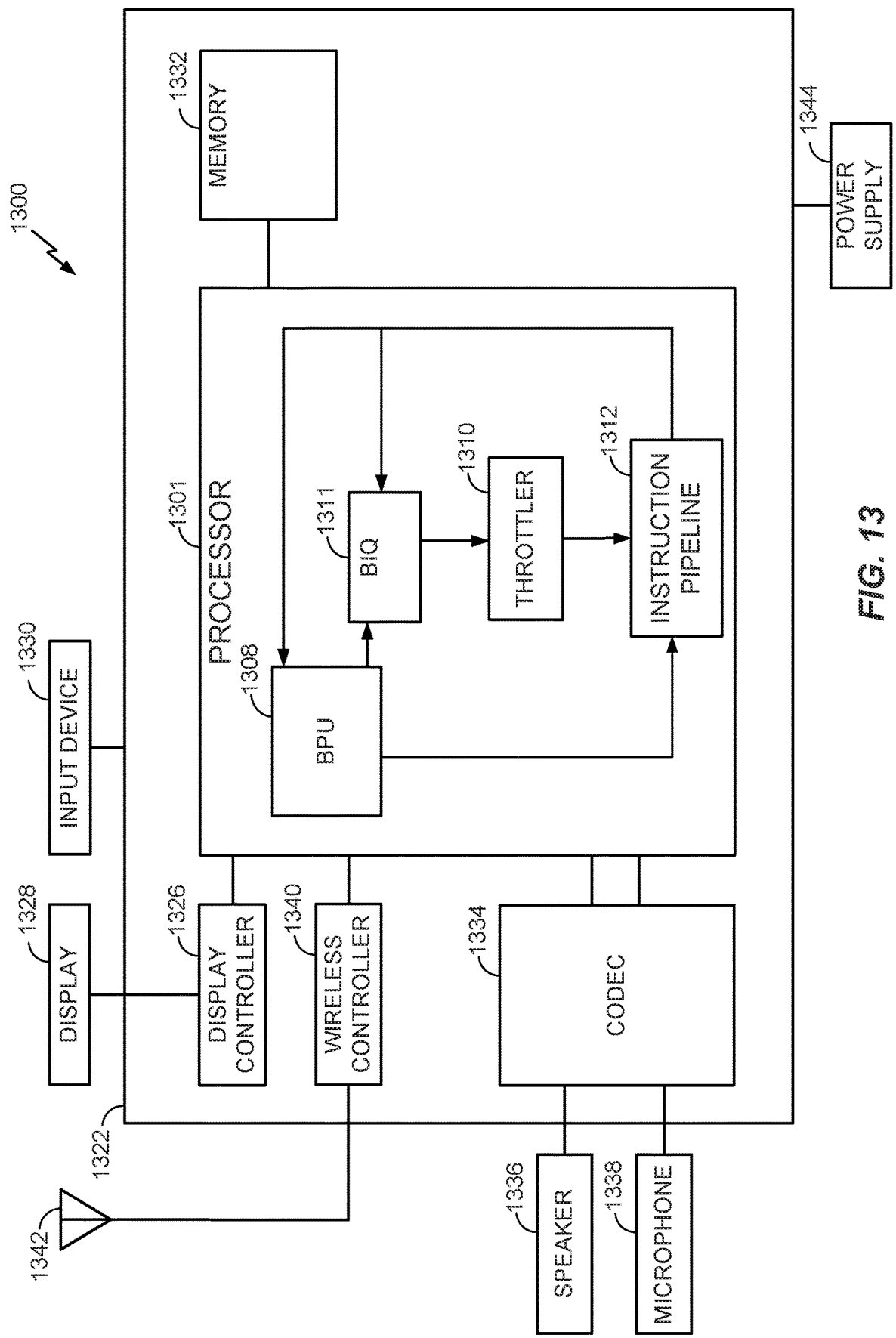
FIG. 13 illustrates an exemplary mobile device in accordance with some examples of the disclosure.

FIG. 13 illustrates an exemplary mobile device in accordance with some examples of the disclosure. Referring now to FIG. 13, a block diagram of a mobile device that is configured according to exemplary aspects is depicted and generally designated 1300. In some aspects, mobile device 1300 may be configured as a wireless communication device. As shown, mobile device 1300 includes processor 1301, which may be configured to implement the methods described herein in some aspects. Processor 1301 is shown to comprise instruction pipeline 1312, buffer processing unit (BPU) 1308, branch instruction queue (BIQ) 1311, and throttler 1310 as is well known in the art. Other well-known details (e.g., counters, entries, confidence fields, weighted sum, comparator, etc.) of these blocks have been omitted from this view of processor 1301 for the sake of clarity.

Processor 1301 may be communicatively coupled to memory 1332 over a link, which may be a die-to-die or chip-to-chip link. Mobile device 1300 also include display 1328 and display controller 1326, with display controller 1326 coupled to processor 1301 and to display 1328.

In some aspects, FIG. 13 may include coder/decoder (CODEC) 1334 (e.g., an audio and/or voice CODEC) coupled to processor 1301; speaker 1336 and microphone 1338 coupled to CODEC 1334; and wireless controller 1340 (which may include a modem) coupled to wireless antenna 1342 and to processor 1301.

In a particular aspect, where one or more of the above-mentioned blocks are present, processor 1301, display controller 1326, memory 1332, CODEC 1334, and wireless controller 1340 can be included in a system-in-package or system-on-chip device 1322. Input device 1330 (e.g., physical or virtual keyboard), power supply 1344 (e.g., battery), display 1328, input device 1330, speaker 1336, microphone 1338, wireless antenna 1342, and power supply 1344 may be external to system-on-chip device 1322 and may be coupled to a component of system-on-chip device 1322, such as an interface or a controller.

It should be noted that although FIG. 13 depicts a mobile device, processor 1301 and memory 1332 may also be integrated into a set top box, a music player, a video player, an entertainment unit, a navigation device, a personal digital assistant (PDA), a fixed location data unit, a computer, a laptop, a tablet, a communications device, a mobile phone, or other similar devices.

Figure 14:
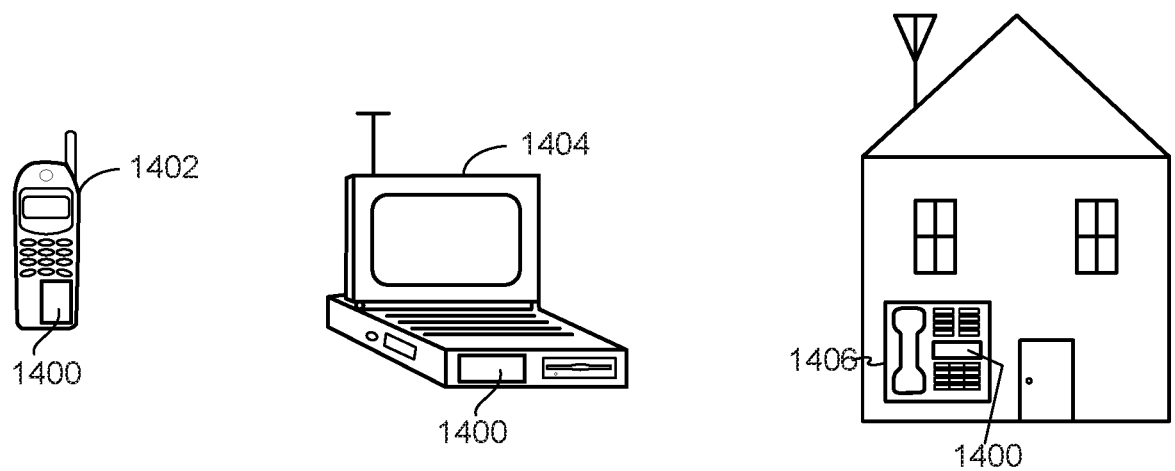
FIG. 14 illustrates various electronic devices that may be integrated with any of the aforementioned integrated device, semiconductor device, integrated circuit, die, interposer, package or package-on-package (PoP) in accordance with some examples of the disclosure.

FIG. 14 illustrates various electronic devices that may be integrated with any of the aforementioned integrated device, semiconductor device, integrated circuit, die, interposer, package or package-on-package (PoP) in accordance with some examples of the disclosure. For example, a mobile phone device 1402, a laptop computer device 1404, and a fixed location terminal device 1406 may include an integrated device 1400 as described herein. The integrated device 1400 may be, for example, any of the integrated circuits, dies, integrated devices, integrated device packages, integrated circuit devices, device packages, integrated circuit (IC) packages, package-on-package devices described herein. The devices 1402, 1404, 1406 illustrated in FIG. 14 are merely exemplary. Other electronic devices may also feature the integrated device 1400 including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), or any other device that stores or retrieves data or computer instructions, or any combination thereof.

It will be appreciated that various aspects disclosed herein can be described as functional equivalents to the structures, materials and/or devices described and/or recognized by those skilled in the art. For example, in one aspect, an apparatus (e.g., IC package 100 in FIG. 1) may comprise a substrate (e.g., substrate 100 in FIG. 1); a first layer (e.g., first layer 120 in FIG. 1) on a first side of the substrate; a means for connection (e.g., plurality of pads 130 in FIG. 1), to such as a semiconductor chip for example, on a first side of the first layer; a means for signal routing (e.g., plurality of traces 140 in FIG. 1) on the first side of the first layer with at least two of the means for signal routing located between two of the means for connection; and a dielectric layer (e.g., dielectric layer 160 in FIG. 1) on the first side of the first layer. The dielectric layer may completely cover the plurality of traces and partially cover the plurality of pads such that a portion of each of the plurality of pads. The apparatus may also include a bump pad (e.g., bump pad 150 in FIG. 1) on the first side of the first layer with the dielectric layer partially covering the bump pad such that a surface of the bump pad is exposed and below a first surface of the dielectric layer opposite the first layer. Each of the plurality of traces may have a width of approximately 10 microns ($\mu$m) and be spaced from another of the plurality of traces by a width of approximately 10 microns ($\mu$m). The first layer and the dielectric layer completely surround the plurality of traces to allow for such small line/space dimensions without the plurality of traces lifting or peeling off during the manufacturing process or afterwards. In addition, a center to center distance between each of the plurality of pads may be approximately 90 microns ($\mu$m) allowing for multiple escape lines (traces between the pads) in the apparatus. It will be appreciated that the aforementioned aspects are merely provided as examples and the various aspects claimed are not limited to the specific references and/or illustrations cited as examples.

One or more of the components, processes, features, and/or functions illustrated in FIGS. 1-14 may be rearranged and/or combined into a single component, process, feature or function or incorporated in several components, processes, or functions. Additional elements, components, processes, and/or functions may also be added without departing from the disclosure. It should also be noted that FIGS. 1-14 and its corresponding description in the present disclosure is not limited to dies and/or ICs. In some implementations, FIGS. 1-14 and its corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a package on package (PoP) device, and/or an interposer.

As used herein, the terms "user equipment" (or "UE"), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals. These terms include, but are not limited to, a music player, a video player, an entertainment unit, a navigation device, a communications device, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). These terms are also intended to include devices which communicate with another device that can receive wireless communication and/or navigation signals such as by short-range wireless, infrared, wire line connection, or other connection, regardless of whether satellite signal reception, assistance data reception, and/or position-related processing occurs at the device or at the other device. In addition, these terms are intended to include all devices, including wireless and wire line communication devices, that are able to communicate with a core network via a radio access network (RAN), and through the core network the UEs can be connected with external networks such as the Internet and with other UEs. Of course, other mechanisms of connecting to the core network and/or the Internet are also possible for the UEs, such as over a wired access network, a wireless local area network (WLAN) (e.g., based on IEEE 802.11, etc.) and so on. UEs can be embodied by any of a number of types of devices including but not limited to printed circuit (PC) cards, compact flash devices, external or internal modems, wireless or wire line phones, smartphones, tablets, tracking devices, asset tags, and so on. A communication link through which UEs can send signals to a RAN is called an uplink channel (e.g., a reverse traffic channel, a reverse control channel, an access channel, etc.). A communication link through which the RAN can send signals to UEs is called a downlink or forward link channel (e.g., a paging channel, a control channel, a broadcast channel, a forward traffic channel, etc.). As used herein the term traffic channel (TCH) can refer to either an uplink/reverse or downlink/forward traffic channel.

The wireless communication between electronic devices can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE), Bluetooth (BT), Bluetooth Low Energy (BLE), IEEE 802.11 (WiFi), and IEEE 802.15.4 (Zigbee/Thread) or other protocols that may be used in a wireless communications network or a data communications network. Bluetooth Low Energy (also known as Bluetooth LE, BLE, and Bluetooth Smart) is a wireless personal area network technology designed and marketed by the Bluetooth Special Interest Group intended to provide considerably reduced power consumption and cost while maintaining a similar communication range. BLE was merged into the main Bluetooth standard in 2010 with the adoption of the Bluetooth Core Specification Version 4.0 and updated in Bluetooth 5 (both expressly incorporated herein in their entirety).

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage or mode of operation. Furthermore, a particular feature and/or structure can be combined with one or more other features and/or structures. Moreover, at least a portion of the apparatus described hereby can be configured to perform at least a portion of a method described hereby.

The terminology used herein is for the purpose of describing particular examples and is not intended to be limiting of examples of the disclosure. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, actions, operations, elements, and/or components, but do not preclude the presence or addition of one or more other features, integers, actions, operations, elements, components, and/or groups thereof.

It should be noted that the terms "connected," "coupled," or any variant thereof, mean any connection or coupling, either direct or indirect, between elements, and can encompass a presence of an intermediate element between two elements that are "connected" or "coupled" together via the intermediate element.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Those skilled in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative logical blocks, modules, and circuits described in connection with the aspects disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or other such configurations). Additionally, these sequence of actions described herein can be considered to be incorporated entirely within any form of computer-readable storage medium having stored therein a corresponding set of computer instructions that upon execution would cause an associated processor to perform the functionality described herein. Thus, the various aspects of the disclosure may be incorporated in a number of different forms, all of which have been contemplated to be within the scope of the claimed subject matter. In addition, for each of the examples described herein, the corresponding form of any such examples may be described herein as, for example, "logic configured to" perform the described action.

Nothing stated or illustrated depicted in this application is intended to dedicate any component, action, feature, benefit, advantage, or equivalent to the public, regardless of whether the component, action, feature, benefit, advantage, or the equivalent is recited in the claims.

Further, those of skill in the art will appreciate that the various illustrative logical blocks, modules, circuits, and algorithm actions described in connection with the examples disclosed herein may be implemented as electronic hardware, computer software, or combinations of both. To clearly illustrate this interchangeability of hardware and software, various illustrative components, blocks, modules, circuits, and actions have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The methods, sequences and/or algorithms described in connection with the examples disclosed herein may be incorporated directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art including non-transitory types of memory or storage mediums. An exemplary storage medium is coupled to the processor such that the processor can read information from, and write information to, the storage medium. In the alternative, the storage medium may be integral to the processor.

Although some aspects have been described in connection with a device, it goes without saying that these aspects also constitute a description of the corresponding method, and so a block or a component of a device should also be understood as a corresponding method action or as a feature of a method action. Analogously thereto, aspects described in connection with or as a method action also constitute a description of a corresponding block or detail or feature of a corresponding device. Some or all of the method actions can be performed by a hardware apparatus (or using a hardware apparatus), such as, for example, a microprocessor, a programmable computer or an electronic circuit. In some examples, some or a plurality of the most important method actions can be performed by such an apparatus.

In the detailed description above it can be seen that different features are grouped together in examples. This manner of disclosure should not be understood as an intention that the claimed examples have more features than are explicitly mentioned in the respective claim. Rather, the disclosure may include fewer than all features of an individual example disclosed. Therefore, the following claims should hereby be deemed to be incorporated in the description, wherein each claim by itself can stand as a separate example. Although each claim by itself can stand as a separate example, it should be noted that-although a dependent claim can refer in the claims to a specific combination with one or a plurality of claims-other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods, systems, and apparatus disclosed in the description or in the claims can be implemented by a device comprising means for performing the respective actions of this method.

Furthermore, in some examples, an individual action can be subdivided into a plurality of sub-actions or contain a plurality of sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. An integrated circuit (IC) package comprising:
   a substrate;
   a plurality of vias that extend from a first side of the substrate to a second side of the substrate opposite the first side of the substrate;
   a plurality of traces proximate to the first side of the substrate, at least one of the plurality of traces located between two of the plurality of vias, and an upper surface of each of the plurality of traces being coplanar with an upper surface of each of the plurality of vias; and
   a plurality of pads on the second side of the substrate, wherein the plurality of vias have a uniform shape with no tapers or steps.

2. The IC package of claim 1, wherein the plurality of traces are embedded in the substrate.

3. The IC package of claim 1, wherein at least two of the plurality of traces are located between at least two of the plurality of vias.

4. The IC package of claim 1, wherein each of the plurality of traces has a width of approximately less than 10 microns (µm) and is spaced from another of the plurality of traces by a width of approximately less than 10 microns (µm).

5. The IC package of claim 1, wherein the IC package is incorporated into a device selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, a laptop computer, a server, and a device in an automotive vehicle.

6. The IC package of claim 1, wherein each of the plurality of pads has a width that is greater than the width of each of the plurality of traces.

7. The IC package of claim 1, wherein each of the plurality of traces has a width of approximately 8 microns (µm) and is spaced from another of the plurality of traces by a width of approximately 10 microns (µm).

8. The IC package of claim 1,
   wherein the plurality of pads is a first plurality of pads, and
   wherein the IC package further comprises a second plurality of pads coupled to a bottom portion of each of the plurality of vias, wherein each of the second plurality of pads has a width that is smaller than a width of each of the plurality of the vias.

* * * * *